US012645014B2

(12) United States Patent
Kim et al.

(10) Patent No.: US 12,645,014 B2
(45) Date of Patent: Jun. 2, 2026

(54) LIGHT CONTROL FILM AND DISPLAY DEVICE HAVING THE SAME

(71) Applicant: LG Display Co., Ltd., Seoul (KR)

(72) Inventors: Seong-Il Kim, Seoul (KR); HyunWoo Jeon, Goyang-si (KR); MinHyung Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 308 days.

(21) Appl. No.: 18/470,179

(22) Filed: Sep. 19, 2023

(65) Prior Publication Data

US 2024/0219610 A1 Jul. 4, 2024

(30) Foreign Application Priority Data

Dec. 30, 2022 (KR) ........................ 10-2022-0190308

(51) Int. Cl.

| | |
|---|---|
| ***G02B 5/00*** | (2006.01) |
| ***G02B 5/02*** | (2006.01) |
| ***G02F 1/13*** | (2006.01) |
| ***G02F 1/1335*** | (2006.01) |
| ***H10K 59/80*** | (2023.01) |

(52) U.S. Cl.

CPC ............. *G02B 5/003* (2013.01); *G02B 5/021* (2013.01); *G02F 1/1306* (2013.01); *G02F 1/133504* (2013.01); *G02F 1/133512* (2013.01); *H10K 59/8792* (2023.02); *G02B 2207/101* (2013.01)

(58) Field of Classification Search

CPC .. G02B 5/003; G02B 5/021; G02B 2207/101; G02B 5/0242; G02B 5/0278; G02B 5/0205; G02B 5/22; G02F 1/1306; G02F 1/133504; G02F 1/133512; G02F 1/133606; G02F 1/1334; G02F 1/133507; H10K 59/8792; H10K 59/875

See application file for complete search history.

(56) References Cited

U.S. PATENT DOCUMENTS

| | | | | |
|---|---|---|---|---|
| 9,772,430 | B2 * | 9/2017 | Yamamoto | G02B 5/0278 |
| 2022/0171104 | A1 * | 6/2022 | Nozawa | C09D 133/066 |
| 2023/0080781 | A1 * | 3/2023 | Zheng | G02B 27/30 359/315 |

FOREIGN PATENT DOCUMENTS

| | | | |
|---|---|---|---|
| JP | 2008542458 | A | 11/2008 |
| KR | 20200082019 | A | 7/2020 |
| KR | 20200115218 | A | 10/2020 |
| KR | 20210077499 | A | 6/2021 |
| KR | 20220072633 | A | 6/2022 |

* cited by examiner

*Primary Examiner* — Mariam Qureshi

(74) *Attorney, Agent, or Firm* — Seed Intellectual Property Law Group LLP

(57) ABSTRACT

The present disclosure relates to a light control film and a display device including the same, and more particularly, a light control film includes a transparent resin layer including a plurality of grooves which is disposed to be spaced apart from each other; and a plurality of light shielding units disposed in the plurality of grooves, and each of the plurality of light shielding units includes a black resin and a plurality of dispersion particles dispersed in the black resin and the dispersion particles have a structure in which a plurality of second hollow particles is coupled onto a surface of a first hollow particle through a linking group and a size of the second hollow particle is smaller than a size of the first hollow particle.

19 Claims, 8 Drawing Sheets

130

LIGHT CONTROL FILM AND DISPLAY DEVICE HAVING THE SAME

CROSS-REFERENCE TO RELATED APPLICATIONS

This application claims the priority of Korean Patent Application No. 10-2022-0190308 filed on Dec. 30, 2022, in the Korean Intellectual Property Office, the disclosure of which is incorporated herein by reference.

BACKGROUND

Field

The present disclosure relates to a light control film and a display device including the same, and more particularly, to a light control film which is capable of providing a uniform optical characteristic and display quality and a display device including the same.

Description of the Related Art

In accordance with the increased demand for personal privacy protection, various related products are being developed in various fields. Among products that guarantee the personal privacy, a demand for a viewing angle control device which is attached to various displays such as a cellular phone, a tablet PC, a monitor, or a display for a vehicle to block lateral light transmission and narrows a viewing angle is increasing year by year.

Therefore, a light control film which provides a narrow viewing angle is disposed above the display panel or the backlight unit to implement a privacy protection function. In some implementations, the light control film is a film in which a transmissive unit and a light shielding unit are alternately disposed. The light shielding unit uses a black resin to block light with an incident angle which is equal to or larger than a predetermined angle, among light incident from a lower portion thereof. Accordingly, light having an incident angle which is equal to or larger than a predetermined angle cannot pass through the light control film so that the light transmittance is significantly reduced at a viewing angle which is equal to or larger than a predetermined angle to implement the privacy protection.

When the light control film including a light shielding unit is disposed on the display panel or the backlight unit, the viewing angle can be limited, but there is a problem in that the front luminance is degraded.

SUMMARY

A light control film which adjusts a refractive index by dispersing hollow particles into the black resin to improve the efficiency of light which is emitted to the front surface. The present disclosure recognizes that the physical property of such a film may not be uniform due to the aggregation phenomenon of the hollow particle so that the optical characteristic and the display quality are not uniform and thus the mura of the image is visibly recognized.

The present disclosure provides a light control film with a uniform physical property by suppressing the aggregation of the hollow particles.

The present disclosure provides a display device which has an excellent front luminance and is capable of controlling the viewing angle.

The present disclosure provides a display device with uniform optical characteristic and display quality and improved mura phenomenon.

Technical features and benefits of the present disclosure are not limited to those above-mentioned, and other technical features and benefits, which are not mentioned above, can be clearly understood by those skilled in the art from the following descriptions.

According to an aspect of the present disclosure, a light control film includes a transparent resin layer including a plurality of grooves which is disposed to be spaced apart from each other; and a plurality of light shielding units disposed in the plurality of grooves, and each of the plurality of light shielding units includes a black resin and a plurality of dispersion particles dispersed in the black resin and the dispersion particles have a structure in which a plurality of second hollow particles is coupled onto a surface of a first hollow particle through a linking group and a size of the second hollow particle is smaller than a size of the first hollow particle.

According to an aspect of the present disclosure, a display device includes a display panel; and a light control film which is disposed above or below the display panel.

Other detailed matters of the example embodiments are included in the detailed description and the drawings.

According to the present disclosure, the light control film provides uniform physical property by reducing aggregation of hollow particles dispersed in the black resin.

The display device including a light control film according to the present disclosure has excellent front luminance and an excellent viewing angle control efficiency.

Further, the display device according to the present disclosure has uniform optical characteristic and display quality.

The effects according to the present disclosure are not limited to the contents exemplified above, and more various effects are included in the present specification.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Figure 1:
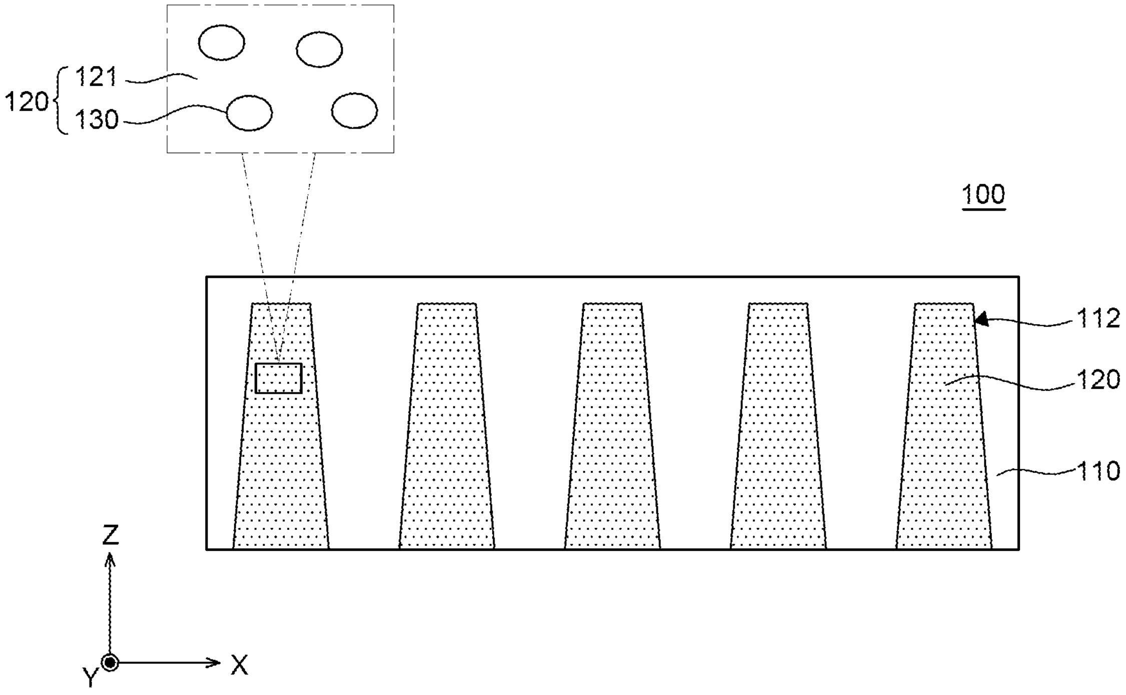
FIG. 1 is a schematic cross-sectional view of a light control film according to an example embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including." "having." and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

In the description herein, "example embodiment," "comparison embodiment," and "experimental embodiment" are used to refer to various embodiments of the disclosure for descriptive purposes only, which do not necessarily mean that some embodiments of the disclosure are for experiment only or for comparison only. The various embodiments described herein and the technical solutions thereof are all parts of the disclosure and may be modified and/or combined in the implementations of the disclosure, which are all within the scope of the disclosure.

Hereinafter, a display device according to example embodiments of the present disclosure will be described in detail with reference to accompanying drawings.

Figure 2:
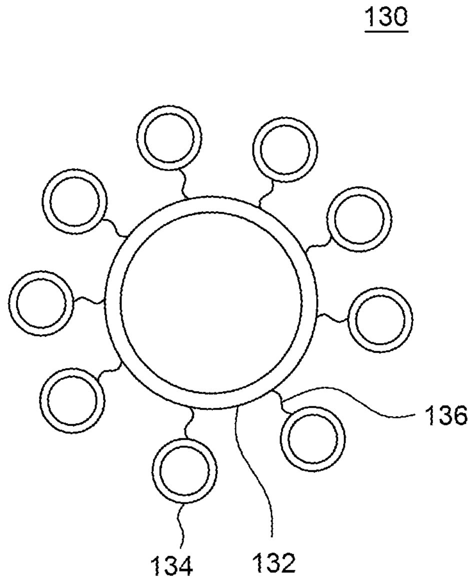
FIG. 2 is a schematic diagram of a dispersion particle in a light control film according to an example embodiment of the present disclosure.

FIG. 1 is a schematic cross-sectional view of a light control film according to an example embodiment of the present disclosure. FIG. 2 is a schematic diagram of a dispersion particle.

First, referring to FIG. 1, a light control film 100 according to an example embodiment of the present disclosure is configured by a transparent resin layer 110, a plurality of grooves 112, and a plurality of light shielding units 120.

The transparent resin layer 110 may be formed of a transparent insulating resin which transmits light incident from the lower portion of the light control film 100 if the light control film 100 is disposed on a display panel or a backlight.

For example, the transparent resin layer 110 may be configured by a thermoplastic resin, a thermosetting resin, photo curable resin, or the like.

For example, the transparent resin layer 110 may be configured by one or more materials selected from an acrylic resin, a urethane resin, an epoxy resin, a silicon-based resin, poly vinyl chloride, polycarbonate, polyethylene terephthalate, triacetyl cellulose resin, polyethylene, polypropylene, and the like. Such resins have excellent curable property, high transparency, and excellent adhesive property.

For example, the transparent resin layer 110 is formed by photo-curing a composition including a monomer, a photo initiator, or the like and the composition may further include a crosslinking agent, a diluent, a release agent, or the like.

In some implementations, for example, the transparent resin layer 110 may be configured by the acrylic resin formed by curing a composition including a UV curable compound, such as a urethane acrylate compound or an epoxy acrylate compound, and the photo initiator.

If the photo initiator is generally used to manufacture a transparent resin in the art, the photo initiator is not In some implementations limited. For example, as the photo initiator, diphenyl (2, 4, 6-trimethylbenzoyl) phosphine oxide, acyl phosphine oxide, or the like may be used, but is not limited thereto.

As described above, the transparent resin layer 110 may further include a release agent. The transparent resin layer 110 includes a plurality of grooves 112 which may be formed by a physical processing method such as a master molding process, an imprinting process, or a photolithography process. The release agent may easily separate a structure for forming a pattern such as a mold for forming the plurality of grooves 112 from the transparent resin layer 110. For example, the release agent may use a silicon-based, polyethylene-based, paraffin-based material, or the like which is generally used in the art without degrading the transparency.

For example, a thickness of the transparent resin layer 110 may be 50 μm to 200 μm, but is not limited thereto.

The transparent resin layer 110 includes a plurality of grooves 112. Each of the plurality of grooves 112 is a space which accommodates a light shielding unit 120 for blocking light having an incident angle which is equal to or larger than a predetermined angle, among light incident from the outside.

Each of the plurality of grooves 112 is formed to penetrate at least a part of the transparent resin layer 110 in a thickness direction (z-axis direction) of the transparent resin layer 110. In some implementations, each of the plurality of grooves 112 is formed to penetrate at least a part of the transparent resin layer 110 from a bottom surface to a top surface of the transparent resin layer 110. Each of the plurality of grooves 112 is formed so as not to completely penetrate the transparent resin layer 110 in the thickness direction. Therefore, the top surface of each of the plurality of grooves 112 may be spaced apart from the top surface of the transparent resin layer 110 with a predetermined interval.

Each of the plurality of grooves 112 is disposed to be spaced apart from each other with a predetermined interval along a first direction (an x-axis direction) which is perpendicular to a thickness direction (a z-axis direction) of the transparent resin layer 110.

Each of the plurality of grooves 112 may be provided as an island on a plane of the transparent resin layer 110. As another example, each of the plurality of grooves 112 extends long along the second direction (y-axis direction) perpendicular to the thickness direction (z-axis direction) of the transparent layer 110 and the first direction (x-axis direction) to be provided with a stripe shape on the plane.

For example, the transparent resin layer 110 including the plurality of grooves 112 may be formed by various known pattern-forming methods, such as known photolithographic process, master molding process, imprinting process, molding process using a roll.

The light shielding unit 120 is disposed in each groove 112. That is, the light shielding unit 120 is filled in each of the plurality of grooves 112. Therefore, each of the plurality of light shielding units 120 is formed to have a size and a shape corresponding to each of the plurality of grooves 112.

Each of the plurality of light shielding units 120 is divided into a lower surface, an upper surface, and a connection unit which connects the lower surface and the upper surface.

Each of the plurality of light shielding units 120 may be formed to have a width which is reduced from the bottom surface to the top surface of the transparent resin layer 110. That is, a width of the lower surface of each of the plurality of light shielding units 120 is larger than a width of the upper surface. For example, a width of the lower surface of each of the plurality of light shielding units 120 may be 5 μm to 30 μm. A width of the upper surface of each of the plurality of light shielding units 120 is smaller than a width of the lower surface and, for example, may be 1 μm to 15 μm.

For example, a distance between the lower surfaces of the adjacent light shielding units 120 may be 15 μm to 50 μm. The distance between the upper surfaces of the adjacent light shielding units 120 may be larger than the distance between the lower surfaces of the adjacent light shielding units 120, and for example, may be 25 μm to 70 μm.

A height of each of the plurality of light shielding units 120 is defined as a straight distance from the lower surface to the upper surface of the light shielding unit 120 and for example, a height of each of the plurality of light shielding units 120 may be 70 μm to 180 μm.

However, a width of the lower surface, a width and a height of the upper surface, and a distance of each of the plurality of light shielding units 120 may be adjusted according to an optical characteristic of a requested light control film, but is not limited the above-described range.

For example, a cross-section of each of the plurality of light shielding units 120 may be a trapezoidal shape. A cross-section of each of the light shielding units 120 may have a pyramid shape with an upper portion cut off. However, the present disclosure is not limited thereto. As another example, a cross-section of each of the plurality of light shielding units 120 may have a triangular shape. As described above, when the plurality of light shielding units 120 is formed to have a trapezoidal shape or a triangular shape with a large lower width and a small upper width, it is advantageous in that the aperture ratio is maintained to be large and the viewing angle can be limited.

A top surface of each of the plurality of light shielding units 120 may be spaced apart from the top surface of the transparent resin layer 110. That is, a height of each of the plurality of light shielding units 120 is smaller than a thickness of the transparent resin layer 110. Accordingly, the transparent resin layer 110 is formed to be in contact with the side surface and the top surface of each of the plurality of light shielding units 120. In this case, after forming the plurality of grooves 112 in the transparent resin layer 110, the leakage of the light shielding resin is suppressed during the process of forming the light shielding unit 120 and the optical characteristic is excellent.

The plurality of light shielding units 120 includes a black resin 121 and a plurality of dispersion particles 130. The dispersion particles are substantially uniformly dispersed in the black resin.

The black resin absorbs light. Accordingly, the light shielding unit 120 blocks light incident at a predetermined incident angle, among light incident from the outside, to provide a narrow viewing angle.

For example, the black resin may be a resin in which black dye is dispersed in a transparent resin.

For example, the transparent resin may be selected from acrylic resin, silicon-based resin, cellulose, polyolefin, polyester, polystyrene, polyurethane, polyvinylchloride, polyacryl, polycarbonate, and the like, but is not limited thereto. The transparent resin may be formed with the same material as the transparent resin layer 110.

For example, the transparent resin may be an acrylic resin formed from a (meth)acrylate-based compound. The transparent resin may be formed from two or more (meth) acrylate-based compounds having different molecular weights.

In some implementations, for example, the transparent resin may be an acrylic resin formed to include one or more compounds selected from pentaerythritol tri(meth)acrylate, pentaerythritol tetra(meth)acrylate, dipentaerythritol, hexa (meth)acrylate, trimethylene propane tri(meth)acrylate, ethylene glycol di(meth)acrylate, 9,9-bis(4-(2-acryloxyethoxyphenyl)fluorene, bis(4-methacryloxythiophenyl)sulfide, and bis(-vinylthiophenyl)sulfide. Further, the transparent resin may be formed to further include a compound including a structure in which two or more molecules of (meth)acrylate-based compounds are connected by a linker. For example, the linker may include a urethane linkage, a thioether linkage, an ether linkage, or an ester linkage. Further, when two or more (meth)acrylate-based compound is used, at least one (meth)acrylate-based compound includes a functional group, such as an epoxy group, a hydroxyl group, a carboxyl group, a thiol group, an aromatic or aliphatic hydrocarbon group having 6 or more carbon atoms, and isocyanate group in a molecule. In this case, the curing speed is excellent and a physical property, such as adhesiveness, is excellent.

For example, the black dye may be an organic black material selected from aniline black, perylene black, lanthanum black, organic black dye, or the like. The organic black dye may be a pigment in which a red dye, a green dye, a blue dye, and the like are mixed. As another example, the black dye may be an inorganic black material selected from carbon black, carbon nano tube, titan black, or the like, but is not limited thereto.

As described above, the plurality of light shielding units blocks light incident at a specific incident angle, among light incident from the outside to provide a viewing angle shielding effect. However, the display device including a light control film has 50% of the front aperture ratio as compared with the display device which does not include the light control film so that the front transmittance is poor.

Accordingly, a study has been conducted to improve the efficiency of light which is emitted to the front by dispersing hollow particles, such as hollow silica, in the black resin to lower the refractive index of the light shielding unit so that the total reflection is induced on a boundary surface of the transparent resin layer and the light shielding unit. However, there is another problem in that the physical property of the light control film is not uniform due to the aggregation of the hollow particles so that an optical characteristic and a display quality are not uniform.

According to the present disclosure, the above-described problem of the related art is solved using a new dispersion particle.

FIG. 2 is a schematic view of a dispersion particle 130 according to an example embodiment of the present disclosure.

The dispersion particle 130 includes a first hollow particle 132, a second hollow particle 134, and a linking group 136. The linking group 136 connects the first hollow particle 132 and the second hollow particle 134. That is, the first hollow particle 132 and the second hollow particle 134 are combined by the linking group 136. Each of the plurality of second hollow particles 134 is coupled onto a surface of the first hollow particle 132 by the linking group 136.

A size of the second hollow particle 134 is smaller than a size of the first hollow particle 132. For example, the size of the first hollow particle 132 may be 150 nm to 1800 nm or 200 nm to 1500 nm. Within this range, the optical characteristic and the display quality are excellent. A size of the second hollow particle 134 is smaller than a size of the first hollow particle 132 and for example, may be 30 nm to 300 nm or 50 nm to 250 nm. Within this range, the optical characteristic and the display quality are excellent. A size of each of the first hollow particle 132 and the second hollow particle 134 may be a diameter of each of the first hollow particle 132 and the second hollow particle 134.

For example, a ratio of a diameter of the second hollow particle 134 to a diameter of the first hollow particle 132 may be 1:4 or more, and in some implementations, 1:5 or more. Within this range, both the front luminance and the viewing angle shielding efficiency can be achieved. In some implementations, a ratio of a diameter of the second hollow particle 134 to a diameter of the first hollow particle 132 may be 1:4 to 40:1 or 1:6 to 40:1. Within this range, both the front luminance and the viewing angle shielding efficiency can be achieved.

As described above, as the plurality of second hollow particles 135 which is smaller than the first hollow particle 132 is coupled onto the surface of the first hollow particle 132, the aggregation between dispersion particles is not easy so that the aggregation phenomenon may be reduced. Accordingly, the light control film according to the example embodiment of the present disclosure reduces the aggregation of the dispersion particles 130 in the light shielding unit 120 to provide uniform optical characteristic and display quality and solve the mura phenomenon due to the aggregation of the hollow particle of the related art.

Each of the first hollow particle 132 and the second hollow particle 134 may be a hollow silica. The hollow silica has a hollow structure. For example, hollowness of each of the first hollow particle 132 and the second hollow particle 134 may be 40% by volume to 90% by volume, respectively. The hollowness may be a volume of a hollow area with respect to a volume of all particles. The hollow silica provides a low refractive index as compared with silica particles having the same size which does not include the hollow structure. In some implementations, the refractive index of the light shielding unit 120 is lower than the refractive index of the transparent resin layer 110, the total reflection is induced at the boundary of the light shielding unit 120 and the transparent resin layer 110, and thus the efficiency of light emitted to the front may be improved.

For example, the refractive index of the first hollow particle 132 may be 1.13 to 1.22. The refractive index of the second hollow particle 134 may be equal to or higher than the refractive index of the first hollow particle 132. For example, the refractive index of the second hollow particle 134 may be 1.18 to 1.25. In this case, by making the refractive index of the light shielding unit 120 lower than the refractive index of the transparent resin layer 110, the total reflection is induced at the interface of the light shielding unit 120 and the transparent resin layer 110 to improve the efficiency of light emitted to the front. Accordingly, light incident at a specific incident angle, among light incident from the outside, is blocked by the plurality of light shielding units 120 to improve the front luminance while providing a viewing angle shielding effect.

The first hollow particle 132 and the second hollow particle 134 may be mixed with a weight ratio of 90:10 to 10:90 or 90:10 to 50:50 in each light shielding unit 120. Within this range, the front luminance may be improved while maintaining a high viewing angle shielding effect.

As described above, the linking group 136 couples each of the plurality of second hollow particles 134 to the surface of the first hollow particle 132.

For example, the linking group 136 may be selected from a siloxane group, a silane group and a urethane group.

For example, In some implementations, the linking group 136 may be selected from groups represented by Formulae 1, 2, and 3.

Formula 1

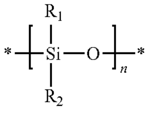

Formula 2

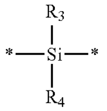

In Formula 1, $R_1$ and $R_2$ may each independently be selected from H and an alkyl group having 1 to 6 carbon atoms.

In Formula 1, n may be an integer of 1 to 200.

In Formula 2, $R_3$ and $R_4$ may each independently be selected from H and an alkyl group having 1 to 10 carbon atoms.

Formula 3

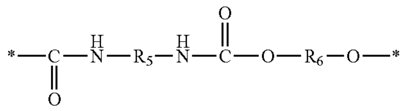

In Formula 3, $R_5$ may be selected from an alkyl group having 1 to 10 carbon atoms, a cycloalkyl group having 3 to 20 carbon atoms, and an aryl group having 6 to 20 carbon atoms, and $R_6$ may be an alkyl group having 1 to 10 carbon atoms.

For example, the dispersion particles may be prepared by modifying a surface of the first hollow particle 132 with a first surface modifying agent, modifying a surface of the second hollow particle 134 with a second surface modifying agent, and then reacting the first surface modifying agent and the second surface modifying agent. That is, the linking group 136 is formed by the reaction of the first surface modifying agent of the first hollow particle 132 and the second surface modifying agent of the second hollow particle 134.

In some implementations, for example, the first hollow particle 132 is surface-modified with multi-functional alcohol ($HO—R_6—OH$), and the second hollow particle 134 is surface-modified with multi-functional isocyanate ($OCN—R_5—NCO$). A urethane-based linking group as represented in Formula 3 is formed by reaction of the multi-functional alcohol ($HO—R_6—OH$) and the multi-functional isocyanate ($OCN—R_5—NCO$). Therefore, the first hollow particle 132 and the second hollow particle 134 are connected by the linking group 136 of Formula 3.

As another example, surfaces of the first hollow particle 132 and the second hollow particle 134 may be modified by a hydroxyl group (—OH) and the hydroxyl group (—OH) of the first hollow particle 132 and the hydroxyl group (—OH) of the second hollow particle 134 react with a silane-based compound, such as alkoxy silane to form a linking group as represented in Formula 1. Therefore, the first hollow particle 132 and the second hollow particle 134 are coupled by the linking group 136 of Formula 1.

The dispersion particles 130 may be dispersed at a concentration of 5% to 30% by weight based on the total weight of the black resin and the dispersion particles 130 in each light shielding unit 120, and within this range, the effect of improving front luminance is excellent.

In some implementations, the dispersion particles 130 can be easily dispersed into the black resin by being dispersed in a dispersion medium and used in a colloidal state. For example, the dispersion particles 130 may be used by dispersing the solid content in a dispersion medium such as water or an organic solvent at a concentration of approximately 5% to 40% by weight. In this case, it is easy to adjust a content of the dispersion particles 130 and the dispersion particles 130 are uniformly dispersed in the black resin to improve a process efficiency.

For example, the organic solvent may use one or more selected from alcohol-based solvent, such as methanol, isopropyl alcohol (IPA), ethylene glycol, and butanol, a ketone-based solvent, such as methyl ethyl ketone and methyl iso butyl ketone (MIBK), an aromatic carbon hydrogen-based solvent, such as toluene and xylene, an amide-based solvent, such as dimethyl formamide, dimethyl acetamide, and N-methyl pyrrolidone, an ester-based solvent, such as ethyl acetate, butyl acetate and γ-butyrolactone, and an ether-based solvent such as tetrahydrofuran and 1,4-dioxane, but is not limited thereto.

In some implementations, for example, the transparent resin and the black dye are mixed to prepare the black resin and separately, the dispersion particles are dispersed in the dispersion medium to be prepared and then a composition for forming the light shielding unit 120 is prepared by mixing them. The composition for forming the light shielding unit 120 is filled in the plurality of grooves 112 of the transparent resin layer 130 and then photo-cured to prepare the light control film 100.

Even though it is not illustrated in the drawing, if necessary, a base member may be selectively disposed above the transparent resin layer 110. The base member supports and protects the light control film 100. For example, the base member may be formed of polyimide, polyethylene terephthalate, cycloolefin polymer, cycloolefin copolymer, triacetyl cellulose, polycarbonate, or the like, but is not limited thereto.

The light control film 100 according to the example embodiment of the present disclosure includes a plurality of light shielding units 120 disposed in the plurality of grooves 112 of the transparent resin layer 110. The plurality of light shielding units 120 includes a black resin and a plurality of dispersion particles. In the dispersion particles 130, each of the plurality of second hollow particles 134 is coupled onto the surface of the first hollow particles 132 by the linking group 136. The size of the second hollow particle 134 is smaller than the size of the first hollow particle 132. Unlike the hollow particle of the related art, the dispersion particles 130 are not aggregated and are maintained to be stably dispersed in the black resin, each discrete from others. Accordingly, the light control film 100 of the present disclosure may provide uniform optical characteristic. Accordingly, the light control film 100 of the present disclosure may be applicable to the display device.

Hereinafter, various display devices including a light control film according to an example embodiment of the present disclosure will be described with reference to FIGS. 3 to 6.

Figure 3:
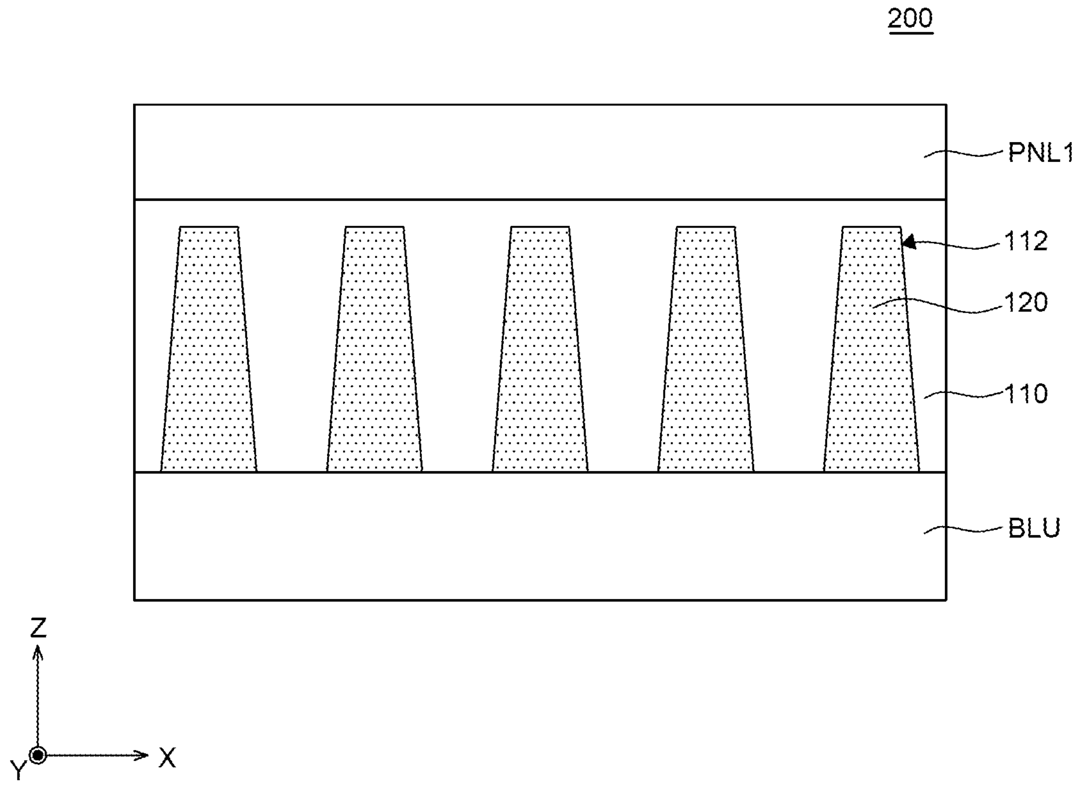
FIG. 3 is a schematic cross-sectional view of a liquid crystal display device according to an example embodiment of the present disclosure.

FIG. 3 is a schematic cross-sectional view of a liquid crystal display device according to an example embodiment of the present disclosure.

Referring to FIGS. 1 to 3 together, a liquid crystal display device 200 according to the example embodiment of the present disclosure includes a backlight unit BLU, a light control film 100, and a liquid crystal display panel PNL1. The light control film 100 of the liquid crystal display device 200 of FIG. 3 is substantially the same as the light control film 100 according to the example embodiment of the present disclosure illustrated in FIGS. 1 and 2. Accordingly, a redundant description will be omitted.

The backlight unit BLU includes a plurality of light sources to supply light to the liquid crystal display panel PNL1. A plurality of light sources is electrically connected to a printed circuit board to be turned on or off. For example, the light source may be a light emitting diode (LED) having advantages of high efficiency, high luminance, and low power consumption, but is not limited thereto.

The backlight unit BLU may include a light diffusion plate disposed on the plurality of light sources to condense and diffuse light emitted from the plurality of light sources so that the light is evenly incident on the liquid crystal display panel PNL1.

A reflective layer which reflects light generated from the light source to the front surface may be disposed on a rear surface of the backlight unit BLU.

The liquid crystal display panel PNL1 is disposed on the backlight unit BLU. The liquid crystal display panel PNL1 includes a liquid crystal layer and controls light transmittance of the liquid crystal to display images.

For example, the liquid crystal display panel PNL1 may include a lower substrate, an upper substrate, a lower polarizer, and an upper polarizer.

The lower substrate supports various components which configure the liquid crystal display panel PNL1. On the lower substrate, a thin film transistor, a pixel electrode which is electrically connected to the thin film transistor, and a common electrode which forms an electric field together with the pixel electrode are disposed. Therefore, the lower substrate may be referred to as a thin film transistor substrate. A liquid crystal layer including liquid crystal molecules is disposed on the thin film transistor substrate.

The upper substrate is opposite to the lower substrate. A color filter layer and a black matrix layer are disposed on the upper substrate. The color filter layer selectively transmits light having a specific wavelength. Light emitted from the backlight unit BLU passes through the liquid crystal layer and the color filter to be converted into light having various colors. The black matrix layer does not allow the thin film transistor, etc., disposed on the lower substrate to be visible to the outside of the liquid crystal display device 200.

The lower polarizer is disposed on a lower surface of the lower substrate to polarize light emitted from the backlight unit BLU toward the liquid crystal display panel PNL1. The upper polarizer is disposed on a top surface of the upper substrate and polarizes light emitted to the outside of the liquid crystal display panel PNL1.

The light control film 100 is disposed between the backlight unit BLU and the liquid crystal display panel PNL1. The light control film 100 includes a transparent resin layer 110 and a plurality of light shielding units 120 and thus, blocks light having an incident angle which is equal to or larger than a predetermined angle, among light emitted from the backlight unit BLU by them. Accordingly, light having an incident angle which is equal to or larger than a predetermined angle is not emitted to the outside of the liquid crystal display panel PNL1 and thus a narrow viewing angle may be provided.

As described above, the light shielding unit 120 of the light control film 100 according to the example embodiment of the present disclosure includes a dispersion particle 130. The dispersion particles 130 include a first hollow particle 132 and a second hollow particle 134 to lower the refractive index of the light shielding unit 120 to induce total reflection at the interface of the transparent resin layer 110 and the light shielding unit 120 to improve the efficiency of light emitted to the front. Therefore, the liquid crystal display device 200 according to the example embodiment of the present disclosure provides an effect of improving both the viewing angle shielding efficiency and the front luminance.

Further, the dispersion particles 130 of the present disclosure has a structure in which a plurality of second hollow particles 134 having a small size is coupled onto a surface of the first hollow particle 132 by a linking group so that the aggregation of the dispersion particles 130 is not easy. Therefore, the dispersion particles 130 are not aggregated in the black resin of the light shielding unit 120 to stably maintain a uniform and dispersed state to provide a uniform optical characteristic and display quality.

Figure 4:
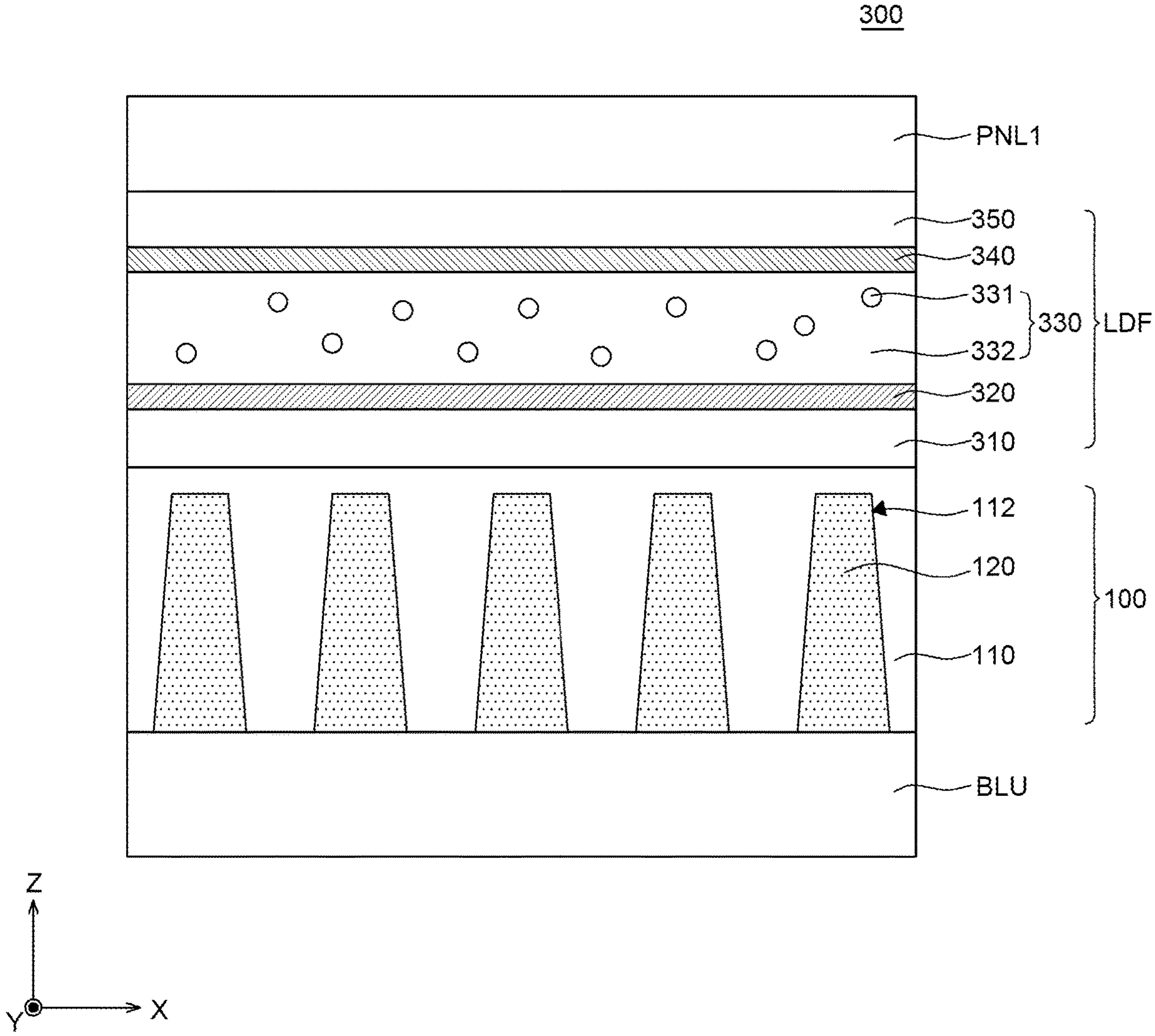
FIG. 4 is a cross-sectional view of a liquid crystal display device according to another example embodiment of the present disclosure.

FIG. 4 is a cross-sectional view of a liquid crystal display device according to another example embodiment of the present disclosure. A liquid crystal display device 300 according to another example embodiment of the present disclosure includes a backlight unit BLU, a light control film 100, a variable light diffusion film LDF, and a liquid crystal display panel PNL1. The light control film 100 of the liquid crystal display device 300 of FIG. 4 is substantially the same as the light control film 100 according to the example embodiment of the present disclosure illustrated in FIGS. 1 and 2. The liquid crystal display device 300 of FIG. 4 is substantially the same as the liquid crystal display device 200 of FIG. 3 except that a variable light diffusion film LDF is further included. Therefore, a description of a repeated configuration will be omitted.

The variable light diffusion film LDF is disposed on the light control film 100. The variable light diffusion film LDF may be bonded onto the light control film 100 by an adhesive layer. The variable light diffusion film LDF provides a switchable viewing angle limiting characteristic which selectively adjusts the viewing angle by applying an electric signal. That is, when the variable light diffusion film LDF is disposed on the light control film 100, a security mode which provides a narrow viewing angle and a sharing mode which provides a wide viewing angle may be freely switched as needed by switching on or off the variable light diffusion film LDF.

The variable light diffusion film LDF includes a first base member 310, a first electrode 320, a variable light diffusion layer 330, a second electrode 340, and a second base member 350.

The first base member 310 and the second base member 350 suppress the variable light diffusion layer 330 from being bent or twisted and protect the variable light diffusion layer 330 from an external environment.

The first base member 310 and the second base member 350 are spaced apart from each other to be opposite to each other with a predetermined interval. The first base member 310 and the second base member 350 may be formed of a transparent material, respectively. For example, the first base member 310 and the second base member 350 may be formed of polyethylene terephthalate or polycarbonate, but are not limited thereto. If necessary, at least one of the first base member 310 and the second base member 350 may be omitted.

The first electrode 320 and the second electrode 340 are electrodes which form an electric field by applying a voltage to the variable light diffusion layer 330. The first electrode 320 and the second electrode 340 are formed of a conductive material. Further, the first electrode 320 and the second electrode 340 may be formed of a transparent conductive material such as indium tin oxide (ITO), aluminum doped zinc oxide (AZO), fluorine tin oxide (FTO), PEDOT:PSS, or silver-nanowire (AgNW), which ensures the transmittance of the variable light diffusion film LDF. However, it is not limited thereto.

The first electrode 320 is disposed on the first base member 310 and the second electrode 340 is disposed on a bottom surface of the second base member 350. However, when the first base member 310 is omitted, the first electrode 320 may be disposed directly on the light control film 100.

The variable light diffusion layer 330 is disposed between the first electrode 320 and the second electrode 340. The variable light diffusion layer 330 is a layer which adjusts whether to diffuse light which passes through the variable light diffusion layer 330 and a diffusion degree.

For example, the variable light diffusion layer 330 may be a polymer diffusion liquid crystal (PDLC) layer having a polymer 332 filled between the first electrode 320 and the second electrode 340 and a droplet 331 including liquid crystal molecules dispersed in the polymer 332.

The plurality of liquid crystal molecules is capsulated to form droplets. The liquid crystal molecules which are randomly disposed and the polymer have different refractive indexes so that light is scattered at the interface of the liquid crystal molecule and the polymer. Accordingly, in a state in which a voltage is not applied through the first electrode 320 and the second electrode 340, light incident to the variable light diffusion layer 330 may be scattered and refracted by the droplet 331 due to a difference in refractive indexes of the liquid crystal molecules in the droplet 331 disposed in irregular directions and the polymer 332.

For example, light which passes the light control film 100 to be incident onto the variable light diffusion layer 330 collides with the droplet 331 of the variable light diffusion layer 330. In a state in which a voltage is not applied, light is scattered and refracted due to the difference in the refractive indexes of the liquid crystal molecules included in the droplet 331 and the polymer 332 to be diffused in a broad range. Therefore, a sharing mode which provides a wide viewing angle operates.

In contrast, when a voltage is applied through the first electrode 320 and the second electrode 340, liquid crystal molecules in the droplet 331 are uniformly aligned in an electric field direction. Therefore, the refractive index of the liquid crystal molecule changes and a transparent state may be obtained by matching the refractive indexes between the liquid crystal molecule in the droplet 331 and the polymer 332.

For example, among light incident from the backlight unit BLU to the light control film 100, light having an incident angle which is equal to or larger than a predetermined angle is blocked and partial light passes through the light control film 100 to be incident onto the variable light diffusion layer 330. Light incident onto the variable light diffusion layer 330 straightly passes through the variable light diffusion layer 330 without being scattered or refracted by the droplet 331. Therefore, the security mode which provides a narrow viewing angle operates.

The security mode which provides the narrow viewing angle and the sharing mode which provides the wide viewing angle may be freely switched depending on whether there is an electric field which is applied to the light diffusion film LDF.

As another example, the variable light diffusion layer 330 may be a vertical alignment mode liquid crystal layer. In this case, in an off-state in which the electric field is not applied, the liquid crystal molecules are vertically disposed to the first base member 310 and the second base member 350 and in an on-state in which the electric field is applied, the liquid crystal molecules are horizontally twisted. Therefore, the alignment of the liquid crystal molecules changes depending on whether there is an electric field to freely switch the security mode which provides a narrow viewing angle and the sharing mode which provides a wide viewing angle.

Accordingly, the liquid crystal display device 300 according to another example embodiment of the present disclosure disposes the variable light diffusion film (LDF) on the light control film 100 to selectively switch the sharing mode and the security mode.

Figure 5:
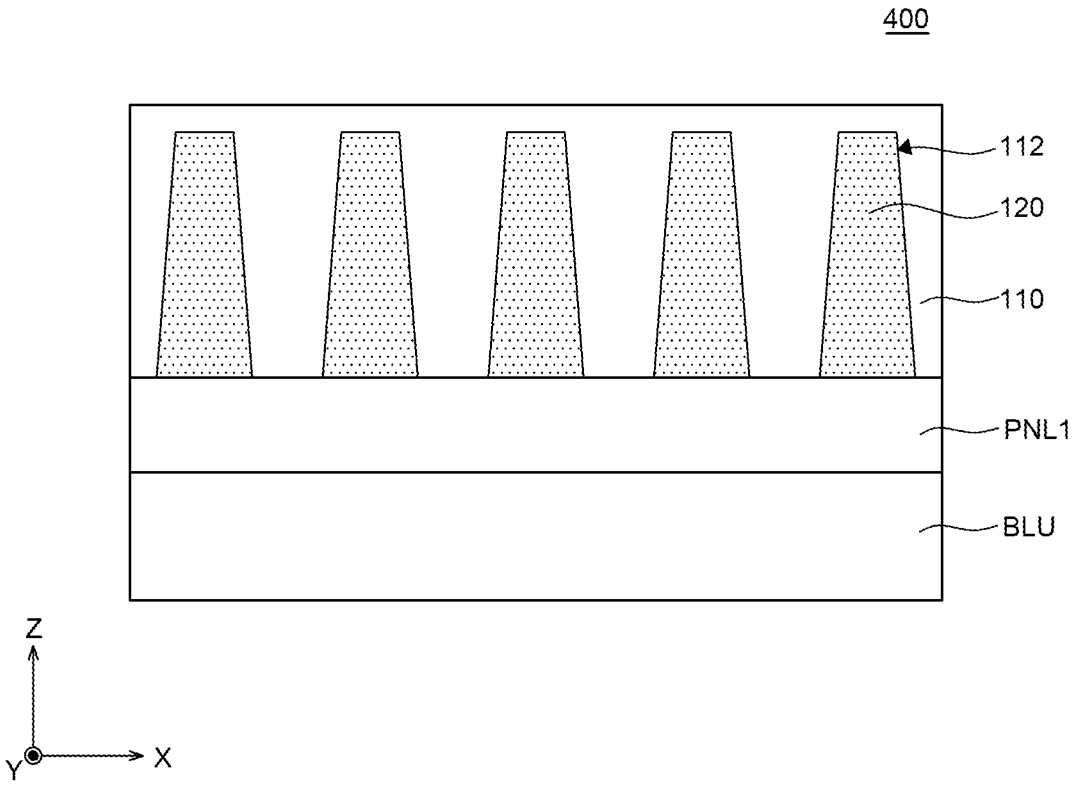
FIG. 5 is a cross-sectional view of a liquid crystal display device according to still another example embodiment of the present disclosure.

FIG. 5 is a cross-sectional view of a liquid crystal display device according to still another example embodiment of the present disclosure. Referring to FIGS. 5, a liquid crystal display device 400 according to still another example embodiment of the present disclosure includes a backlight unit BLU, a liquid crystal display panel PNL1, and a light control film 100. The light control film 100 of the liquid crystal display device 400 of FIG. 5 is substantially the same as the light control film 100 according to the example embodiment of the present disclosure illustrated in FIGS. 1 and 2. The liquid crystal display device 400 of FIG. 5 is substantially the same as the liquid crystal display device 200 of FIG. 3 except a placement position of a light control film 100. Therefore, a description of a repeated configuration will be omitted.

Referring to FIG. 5, the light control film 100 may be disposed above the liquid crystal panel PNL1.

The light control film 100 may be disposed above the liquid crystal display panel PNL1 according to a design structure of the liquid crystal display device 400.

In the present example embodiment, as compared with the display device 200 illustrated in FIG. 3, only the placement position of the light control film 100 is different so that the effect obtained by providing the light control film 100 is the same. Accordingly, a redundant description will be omitted.

Even though it is not illustrated in FIG. 5, the light diffusion film LDF described in FIG. 4 will be selectively disposed on the light control film 100 as needed to freely switch the security mode and the sharing mode.

Figure 6:
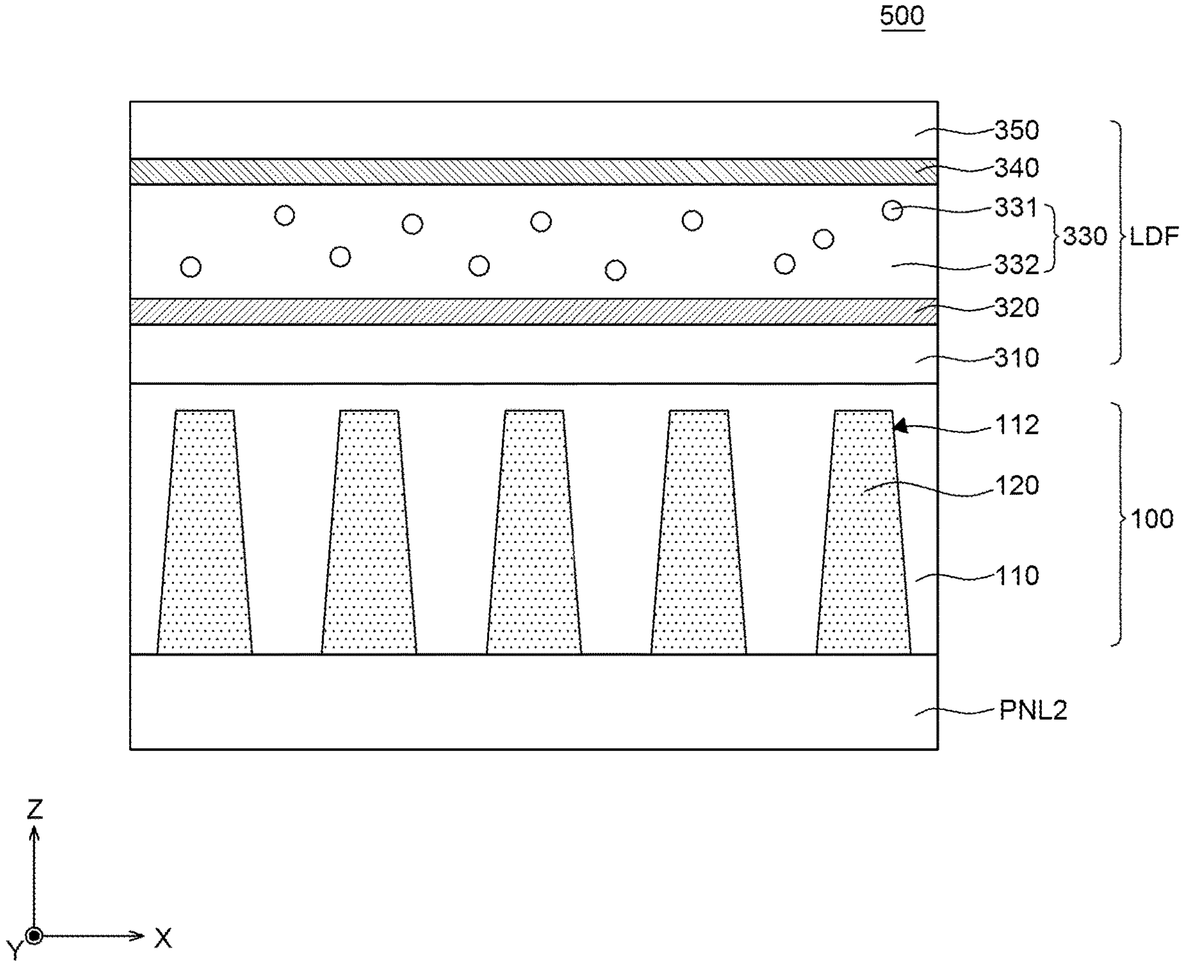
FIG. 6 is a cross-sectional view of an organic light emitting display device according to an example embodiment of the present disclosure.

FIG. 6 is a cross-sectional view of an organic light emitting display device according to an example embodiment of the present disclosure. Referring to FIG. 6, the organic light emitting display device 500 according to the example embodiment of the present disclosure includes an organic light emitting display panel PNL2, a light control film 100, and a light diffusion film LDF. The light control film 100 of the organic light emitting display device 500 of FIG. 6 is substantially the same as the light control film 100 according to the example embodiment of the present disclosure illustrated in FIGS. 1 and 2. The light diffusion film LDF of the organic light emitting display device 500 of FIG. 6 is substantially the same as the light diffusion film LDF provided in the liquid crystal display device 300 illustrated in FIG. 4. Accordingly, a redundant description will be omitted.

The organic light emitting display panel PNL2 includes an organic light emitting layer to display images using light emitted therefrom. For example, the organic light emitting display panel PNL2 includes a substrate, a thin film transistor, an anode, an organic light emitting stack, a cathode, and an encapsulation layer.

The substrate is a base member which supports various elements of the organic light emitting display panel PNL2 and may be formed of an insulating material. For example, the substrate may be a glass substrate or a plastic substrate. For example, the plastic substrate may be selected from polyimide, polyethersulfone, polyethylene terephthalate, and polycarbonate, but is not limited thereto.

The thin film transistor is disposed on the substrate. The thin film transistor includes a gate electrode, an active layer, a source electrode, and a drain electrode. For example, the active layer is disposed on the substrate and a gate insulating layer is disposed on the active layer to insulate the active layer from the gate electrode. Further, an interlayer insulating layer which insulates the gate electrode from the source electrode and the drain electrode is disposed on the substrate. The source electrode and the drain electrode which are in contact with the active layer, respectively are formed on the interlayer insulating layer. A planarization layer may be disposed on the thin film transistor. The planarization layer planarizes an upper portion of the thin film transistor. The planarization layer may include a contact hole which electrically connects the thin film transistor and the anode.

The anode is disposed on the planarization layer. The anode is a component which supplies holes to the organic light emitting layer and is formed of a conductive material having a high work function. The anode may be divided for each of the sub pixels. The cathode is disposed on the anode. The cathode may be formed of a metal material having a low work function to smoothly supply electrons to the organic light emitting layer. The cathode is formed on the anode as one layer without being patterned. That is, the cathode is not divided for every sub pixel area but is formed as a continuous single layer. The organic light emitting layer is disposed between the anode and the cathode. The organic light emitting layer is a layer in which electrons and holes are coupled to emit light. An encapsulation layer which reduces degradation of the display panel due to moisture or oxygen and planarizes an upper surface of the organic light emitting display panel PNL2 may be disposed on the cathode.

The light control film 100 is disposed on the organic light emitting display panel PNL2. For example, the light control film 100 may disposed on the encapsulation layer of the organic light emitting display panel PNL2.

The light control film 100 is disposed on the organic light emitting display panel PNL2 to block light having an incident angle which is equal to or larger than a predetermined angle, among light emitted from the organic light emitting layer.

The light diffusion film LDF is disposed on the light control film 100 to selectively switch a security mode which provides a narrow viewing angle by straightly passing light incident from the light control film 100 depending on the electric field and a sharing mode which provides a wide viewing angle by diffusing light incident from the light control film 100.

Even though in FIG. 6, it is illustrated that the light diffusion film LDF is disposed on the light control film 100, if it is not necessary to selectively switch the sharing mode and the security mode, the light diffusion film LDF may be omitted.

Hereinafter, the effects of the present disclosure will be described in more detail with reference to Example Embodiments. However, the following Example Embodiments are set forth to illustrate the present disclosure, but the scope of the disclosure is not limited thereto.

Example Embodiment 1-1

First, a dispersion particle with a structure illustrated in FIG. 2 was dispersed in a black resin with a concentration of 5% by weight to prepare a light shielding unit composition. Next, a transparent resin layer including a plurality of grooves was prepared and after filling and curing the light shielding unit composition in each of the plurality of grooves, a light control film with the same structure illustrated in FIG. 1 was produced. At this time, a first hollow particle of the dispersion particle was a hollow silica having a diameter of approximately 300 nm, a hollowness of 40% by volume to 90% by volume, and a refractive index of 1.15. A second hollow particle was a hollow silica having a diameter of approximately 50 nm, a hollowness of 40% by volume to 90% by volume, and a refractive index of 1.25. Further, the first hollow particle and the second hollow particle were coupled to be prepared by a linking group represented by Formula 3.

Example Embodiment 1-2

The light control film was prepared in the same manner as in Example Embodiment 1-1, except that the dispersion particles was dispersed at a concentration of 10% by weight.

Example Embodiment 1-3

The light control film was prepared in the same manner as in Example Embodiment 1-1, except that the dispersion particles was dispersed at a concentration of 20% by weight.

Comparison Embodiment 1

The light control film was prepared in the same manner as in Example Embodiment 1-1, except that addition of the dispersion particles was omitted and the light shielding unit was formed only with the black resin.

Comparison Embodiment 2

The light control film was prepared in the same manner as in Example Embodiment 1-2, except that a hollow silica having a diameter of approximately 300 nm, a hollowness of 40% by volume to 90% by volume, and a refractive index of 1.15 was used as the dispersion particles.

Experimental Embodiment 1

Figure 7:
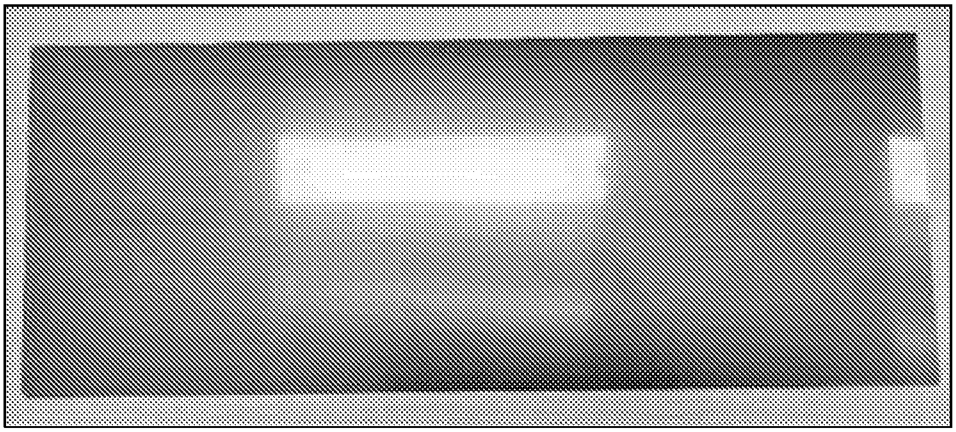
FIG. 7 is a photograph of a light control film according to example Embodiment 1-2.

Luminance was measured in the front (0°) and 45° up and down directions for the light control films of Example Embodiments 1-1 to 1-3, and Comparison embodiments 1 and 2. In order to identify the uniformity of the light control film, the light control film was divided into nine areas AR1 to AR9 and physical property was measured for each of the nine areas. The results thereof were represented in Tables 1 and 2, and FIGS. 7 and 8. FIG. 7 is a photograph of a light control film according to Example Embodiments 1-2 and FIG. 8 is a photograph of a light control film according to Comparison embodiment 2.

TABLE 1

| | Classification | | | | | | | | |
|---|---|---|---|---|---|---|---|---|---|
| | Comp. Em. 1 | | | Comp. Em. 2 | | | Ex. Em. 1-2 | | |
| | Viewing angle | | | | | | | | |
| | −45° | 0° | 45° | −45° | 0° | 45° | −45° | 0° | 45° |
| AR1 | 15.3 | 332.8 | 16.8 | 9.2 | 332 | 7.6 | 10.4 | 174.2 | 11.4 |
| AR2 | 15.4 | 153.6 | 16.9 | 12.2 | 201 | 10.05 | 10.4 | 175.1 | 11.5 |
| AR3 | 15.3 | 153 | 16.8 | 14.2 | 234 | 11.7 | 10.4 | 174.4 | 11.4 |
| AR4 | 15.7 | 156.6 | 17.2 | 9.5 | 156 | 7.8 | 10.6 | 178.5 | 11.7 |
| AR5 | 15.8 | 158.2 | 17.4 | 7.5 | 123 | 6.15 | 10.8 | 180.3 | 11.8 |
| AR6 | 15.2 | 331.7 | 16.7 | 6.1 | 101 | 5.05 | 10.3 | 172.9 | 11.3 |
| AR7 | 15.3 | 153.1 | 16.8 | 11.9 | 190 | 9.5 | 10.4 | 174.5 | 11.5 |
| AR8 | 15.9 | 159 | 17.5 | 10.9 | 179 | 8.95 | 10.8 | 181.3 | 11.9 |
| AR9 | 15.4 | 153.5 | 16.9 | 8.1 | 134 | 6.7 | 10.4 | 175.0 | 11.5 |
| Average | 15.5 | 154.6 | 17.0 | 10.0 | 163 | 8.2 | 10.5 | 176.2 | 11.6 |

Figure 8:
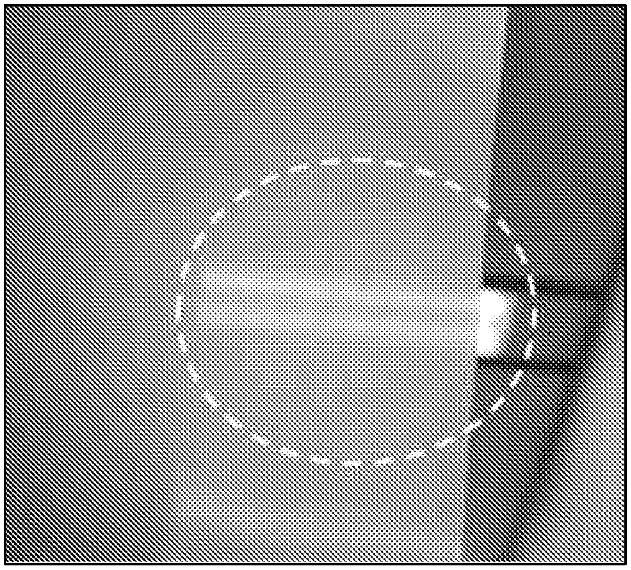
FIG. 8 is a photograph of a light control film according to Comparison embodiment 2.

First, referring to Table 1 and FIGS. 7 and 8, in the case of Example Embodiment 1-2 in which a dispersion particle with a new structure was applied, the front luminance was 176.2 which was the most excellent result and the luminance in 45° up and down directions was lower than that of Comparison embodiment 1. Therefore, it was confirmed that the front luminance and the viewing angle shielding efficiency were simultaneously improved.

In the meantime, in Comparison embodiment 2, the hollow silica was applied so that it was confirmed that the front luminance and the viewing angle shielding effect were improved more than Comparison embodiment 1. However, it was confirmed that the effect was inferior to Example Embodiment 1-2 and the luminance deviation for each area was the largest. For example, in Comparison embodiment 2, in the areas AR3 and AR6, the front luminances were 234 and 101, respectively, which was significantly different from the average (163).

In contrast, in Example Embodiment 1-2, a new dispersion particles were applied so that the front luminance deviation in the areas AR1 to AR9 was approximately 5.

Therefore, it was confirmed that the optical characteristic of the film was uniform as compared with Comparison embodiment 2.

With regard to this, when comparing FIGS. 7 and 8, it was confirmed that the light control film of Example Embodiment 1-2 illustrated in FIG. 7 had a uniform surface without mura, but in the light control film of Comparison embodiment 2 illustrated in FIG. 8, aggregation was locally generated.

In summary, when a hollow silica with a simple structure is applied, the front luminance and the viewing angle shielding efficiency are improved, but there is a problem in that the physical property of the film is not uniform due to the aggregation of the hollow silica. According to the present disclosure, a dispersion particles with a new structure in which the first hollow silica and the second hollow silica are coupled by a linking group is applied to suppress the aggregation of the dispersion particles. Therefore, a light control film in which the front luminance and the viewing angle shielding efficiency are further improved and the physical property is uniform may be provided.

TABLE 2

| | Classification | | | | | | | | |
|---|---|---|---|---|---|---|---|---|---|
| | Ex. Em. 1-1 | | | Ex. Em. 1-2 | | | Ex. Em. 1-3 | | |
| | Viewing angle | | | | | | | | |
| | −45° | 0° | 45° | −45° | 0° | 45° | −45° | 0° | 45° |
| AR1 | 10.7 | 163.5 | 11.8 | 10.4 | 174.2 | 11.4 | 10.1 | 180.3 | 11.1 |
| AR2 | 10.8 | 164.4 | 11.8 | 10.4 | 175.1 | 11.5 | 10.1 | 181.2 | 11.2 |
| AR3 | 10.7 | 163.7 | 11.8 | 10.4 | 174.4 | 11.4 | 10.1 | 180.5 | 11.1 |
| AR4 | 11.0 | 167.6 | 12.1 | 10.6 | 178.5 | 11.7 | 10.3 | 184.8 | 11.4 |
| AR5 | 11.1 | 169.3 | 12.2 | 10.8 | 180.3 | 11.8 | 10.4 | 186.7 | 11.5 |
| AR6 | 10.6 | 162.3 | 11.7 | 10.3 | 172.9 | 11.3 | 10.0 | 179.0 | 11.0 |
| AR7 | 10.7 | 163.8 | 11.8 | 10.4 | 174.5 | 11.5 | 10.1 | 180.7 | 11.1 |
| AR8 | 11.1 | 170.1 | 12.2 | 10.8 | 181.3 | 11.9 | 10.5 | 187.6 | 11.5 |
| AR9 | 10.7 | 164.2 | 11.8 | 10.4 | 175.0 | 11.5 | 10.1 | 181.1 | 11.1 |
| Average | 10.8 | 165.4 | 11.9 | 10.5 | 176.2 | 11.6 | 10.2 | 182.4 | 11.2 |

In Table 2, in order to confirm an effect of the new dispersion particles for every content, results of Example Embodiments 1-1 to 1-3 are represented. Referring to Table 2, it is confirmed that as the content of the dispersion particles is increased to 5% by weight, 10% by weight, and 20% by weight, the front luminance is further improved while maintaining the high viewing angle shielding efficiency.

Comparison Embodiment 2-1

The light control film was prepared in the same manner as in Example Embodiment 1-2, except that a hollow silica having a diameter of approximately 100 nm, a hollowness of 40% by volume to 90% by volume, and a refractive index of 1.2 was used as the second hollow particle.

Comparison Embodiment 2-2

The light control film was prepared in the same manner as in Example Embodiment 1-2, except that a hollow silica having a diameter of approximately 150 nm, a hollowness of 40% by volume to 90% by volume, and a refractive index of 1.2 was used as the second hollow particle.

Comparison Embodiment 2-3

The light control film was prepared in the same manner as in Example Embodiment 1-2, except that a hollow silica having a diameter of approximately 200 nm, a hollowness of 40% by volume to 90% by volume, and a refractive index of 1.2 was used as the second hollow particle.

Experimental Embodiment 2

Luminance was measured in the front (0°) and 45° up and down directions for the light control films of Comparison embodiments 2-1 to 2-3. In order to confirm the uniformity of the light control film, the light control film was divided into nine areas AR1 to AR9 and the physical property was measured for each of the nine areas. The results were represented in Table 3.

TABLE 3

| | Classification | | | | | | | | |
|---|---|---|---|---|---|---|---|---|---|
| | Comp. Em. 2-1 | | | Comp. Em. 2-2 | | | Comp. Em. 2-3 | | |
| | Diameter ratio* | | | | | | | | |
| | 1:3 | | | 1:2 | | | 1:1.5 | | |
| | Viewing angle | | | | | | | | |
| | −45° | 0° | 45° | −45° | 0° | 45° | −45° | 0° | 45° |
| AR1 | 10.7 | 169.0 | 11.8 | 10.9 | 165.5 | 12.0 | 11.1 | 162.0 | 12.2 |
| AR2 | 10.8 | 169.9 | 11.8 | 11.0 | 166.3 | 12.1 | 11.2 | 162.8 | 12.3 |
| AR3 | 10.7 | 169.2 | 11.8 | 10.9 | 165.7 | 12.0 | 11.1 | 162.2 | 12.2 |
| AR4 | 11.0 | 173.2 | 12.1 | 11.2 | 169.6 | 12.3 | 11.4 | 166.0 | 12.5 |
| AR5 | 11.1 | 174.9 | 12.2 | 11.3 | 171.3 | 12.4 | 11.5 | 167.7 | 12.7 |
| AR6 | 10.6 | 167.7 | 11.7 | 10.8 | 164.3 | 11.9 | 11.0 | 160.8 | 12.1 |
| AR7 | 10.7 | 169.3 | 11.8 | 10.9 | 165.8 | 12.0 | 11.1 | 162.3 | 12.3 |
| AR8 | 11.1 | 175.8 | 12.2 | 11.4 | 172.2 | 12.5 | 11.6 | 168.6 | 12.7 |
| AR9 | 10.8 | 169.7 | 11.8 | 11.0 | 166.2 | 12.1 | 11.2 | 162.7 | 12.3 |
| Average | 10.8 | 171.0 | 11.9 | 11.0 | 167.4 | 12.1 | 11.2 | 163.9 | 12.4 |

(A diameter ratio is a ratio of a diameter of a second hollow particle to a diameter of the first hollow particle)

First, in Example Embodiment 1-2 in Table 1, a diameter ratio of a diameter of a second hollow particle to a diameter of the first hollow particle is 1:6, an average front luminance is 176.2, a luminance at −45° is 10.5 and a luminance at 45° is 11.6.

In contrast, it is confirmed that in Comparison embodiment 2-1 in which a diameter of a second hollow particle to a diameter of the first hollow particle is 1:3, the front luminance is 171.0 which is inferior to Example Embodiment 1-2. It is further confirmed that a luminance at −45° and at 45° are 10.8, and 15.6 respectively so that the viewing angle shielding effect is inferior to Example Embodiment 1-2.

Further, from the results of Comparison embodiments 2-2 and 2-3, it is confirmed that the smaller the difference in the diameter of the first hollow particle and the second hollow particle, the lower the front luminance and the luminance at 45°.

Example Embodiment 3-1

The light control film was prepared in the same manner as in Example Embodiment 1-2, except that a hollow silica having a diameter of approximately 500 nm, a hollowness of 40% by volume to 90% by volume, and a refractive index of 1.2 was used as the first hollow particle.

Example Embodiment 3-2

The light control film was prepared in the same manner as in Example Embodiment 1-2, except that a hollow silica having a diameter of approximately 1000 nm, a hollowness of 40% by volume to 90% by volume, and a refractive index of 1.2 was used as the first hollow particle.

Example Embodiment 3-3

The light control film was prepared in the same manner as in Example Embodiment 1-2, except that a hollow silica having a diameter of approximately 1500 nm, a hollowness of 40% by volume to 90% by volume, and a refractive index of 1.2 was used as the first hollow particle.

Experimental Embodiment 3

Luminance was measured in the front (0°) and 45° up and down directions for the light control films of Example Embodiments 3-1 to 3-3. In order to confirm the uniformity of the light control film, the light control film was divided into nine areas AR1 to AR9 and the physical property was measured for each of the nine areas. The result was represented in Table 4.

TABLE 4

| | Classification | | | | | | | | |
|---|---|---|---|---|---|---|---|---|---|
| | Ex. Em. 3-1 | | | Ex. Em. 3-2 | | | Ex. Em. 3-3 | | |
| | Diameter ratio* | | | | | | | | |
| | 1:10 | | | 1:20 | | | 1:30 | | |
| | Viewing angle | | | | | | | | |
| | −45° | 0° | 45° | −45° | 0° | 45° | −45° | 0° | 45° |
| AR1 | 9.4 | 191.6 | 10.3 | 8.8 | 200.3 | 9.7 | 9.5 | 189.9 | 10.4 |
| AR2 | 9.4 | 192.6 | 10.3 | 8.9 | 201.4 | 9.8 | 9.5 | 190.9 | 10.5 |
| AR3 | 9.4 | 191.9 | 10.3 | 8.8 | 200.6 | 9.7 | 9.5 | 190.1 | 10.4 |
| AR4 | 9.6 | 196.4 | 10.5 | 9.1 | 205.3 | 10.0 | 9.7 | 194.6 | 10.7 |
| AR5 | 9.7 | 198.4 | 10.7 | 9.1 | 207.4 | 10.1 | 9.8 | 196.6 | 10.8 |
| AR6 | 9.3 | 190.2 | 10.2 | 8.8 | 198.9 | 9.6 | 9.4 | 188.5 | 10.3 |
| AR7 | 9.4 | 192.0 | 10.3 | 8.8 | 200.7 | 9.7 | 9.5 | 190.2 | 10.4 |
| AR8 | 9.7 | 199.4 | 10.7 | 9.2 | 208.4 | 10.1 | 9.8 | 197.6 | 10.8 |
| AR9 | 9.4 | 192.5 | 10.3 | 8.9 | 201.2 | 9.8 | 9.5 | 190.7 | 10.4 |
| Average | 9.5 | 193.9 | 10.4 | 8.9 | 202.7 | 9.8 | 9.6 | 192.1 | 10.5 |

(A diameter ratio is a ratio of a diameter of the second hollow particle to a diameter of a first hollow particle)

When Example Embodiment 1-2 of Table 1 and Example Embodiments 3-1, 3-2, and 3-3 of Table 4 are compared, it is confirmed that the front luminance and the viewing angle shielding efficiency of Example Embodiments 3-1, 3-2, and 3-3 having a large diameter ratio of 1:1, 1:20, and 1:30 are more excellent than Example Embodiment 1-2 having a diameter ratio of the diameter of the second hollow particle to the diameter of the first hollow particle of 1:6.

In some implementations, it is confirmed that Example Embodiment 3-2 having a diameter ratio of the diameter of the second hollow particle to the diameter of the first hollow particle of 1:20 has the front luminance of 202.7 which is the most excellent.

Example Embodiment 4-1

The light control film was prepared in the same manner as in Example Embodiment 1-2, except that a hollow silica having a diameter of approximately 500 nm, a hollowness of 40% by volume to 90% by volume, and a refractive index of 1.2 was used as the first hollow particle and a hollow silica having a diameter of approximately 100 nm, a hollowness of 40% by volume to 90% by volume, and a refractive index of 1.2 was used as the second hollow particle.

Example Embodiment 4-2

The light control film was prepared in the same manner as in Example Embodiment 1-2, except that a hollow silica having a diameter of approximately 1000 nm, a hollowness of 40% by volume to 90% by volume, and a refractive index of 1.2 was used as the first hollow particle and a hollow silica having a diameter of approximately 150 nm, a hollowness of 40% by volume to 90% by volume, and a refractive index of 1.2 was used as the second hollow particle.

Example Embodiment 4-3

The light control film was prepared in the same manner as in Example Embodiment 1-2, except that a hollow silica having a diameter of approximately 1500 nm, a hollowness of 40% by volume to 90% by volume, and a refractive index of 1.2 was used as the first hollow particle and a hollow silica having a diameter of approximately 200 nm, a hollowness of 40% by volume to 90% by volume, and a refractive index of 1.2 was used as the second hollow particle.

Experimental Embodiment 4

Luminance was measured in the front (0°) and 45° up and down directions for the light control films of Example Embodiments 4-1 to 4-3. In order to confirm the uniformity of the light control film, the light control film was divided into nine areas AR1 to AR9 and the physical property was measured for each of the nine areas. The result was represented in Table 5.

TABLE 5

| | Classification | | | | | | | | |
|---|---|---|---|---|---|---|---|---|---|
| | Ex. Em. 4-1 | | | Ex. Em. 4-2 | | | Ex. Em. 4-3 | | |
| | Diameter ratio* | | | | | | | | |
| | 1:5 | | | 1:6.6 | | | 1:7.5 | | |
| | Viewing angle | | | | | | | | |
| | −45° | 0° | 45° | −45° | 0° | 45° | −45° | 0° | 45° |
| AR1 | 10.6 | 170.7 | 11.7 | 10.0 | 181.2 | 11.0 | 9.4 | 191.6 | 10.3 |
| AR2 | 10.7 | 171.6 | 11.7 | 10.0 | 182.1 | 11.0 | 9.4 | 192.6 | 10.3 |
| AR3 | 10.6 | 170.9 | 11.7 | 10.0 | 181.4 | 11.0 | 9.4 | 191.9 | 10.3 |
| AR4 | 10.9 | 175.0 | 11.9 | 10.2 | 185.7 | 11.2 | 9.6 | 196.4 | 10.5 |
| AR5 | 11.0 | 176.7 | 12.1 | 10.3 | 187.6 | 11.4 | 9.7 | 198.4 | 10.7 |
| AR6 | 10.5 | 169.5 | 11.6 | 9.9 | 179.9 | 10.9 | 9.3 | 190.2 | 10.2 |
| AR7 | 10.6 | 171.0 | 11.7 | 10.0 | 181.5 | 11.0 | 9.4 | 192.0 | 10.3 |
| AR8 | 11.0 | 177.6 | 12.1 | 10.4 | 188.5 | 11.4 | 9.7 | 199.4 | 10.7 |
| AR9 | 10.6 | 171.5 | 11.7 | 10.0 | 182.0 | 11.0 | 9.4 | 192.5 | 10.3 |
| Average | 10.7 | 172.7 | 11.8 | 10.1 | 183.3 | 11.1 | 9.5 | 193.9 | 10.4 |

(A diameter ratio is a ratio of a diameter of the second hollow particle to a diameter of a first hollow particle)

Referring to Example Embodiment 1-2 in Table 1 and Example Embodiments 4-1, 4-2, and 4-3 in Table 5 together, it is confirmed that as the diameter ratio of the diameter of the second hollow particle to the diameter of the first hollow particle is increased to 1:5, 1:6, 1:6.6, and 1:7.5, the front luminance is further improved.

It is further confirmed that as the diameter ratio of the diameter of the second hollow particle to the diameter of the first hollow particle is increased to 1:5, 1:6, 1:6.6, and 1:7.5, the luminance at 45° up and down direction is reduced so that the viewing angle shielding efficiency is improved.

The example embodiments of the present disclosure can also be described as follows:

According to an aspect of the present disclosure, a light control film comprises a transparent resin layer including a plurality of grooves which is disposed to be spaced apart from each other; and a plurality of light shielding units disposed in the plurality of grooves, wherein each of the plurality of light shielding units includes a black resin and a plurality of dispersion particles dispersed in the black resin and the dispersion particles has a structure in which each of a plurality of second hollow particles is coupled onto a surface of a first hollow particle through a linking group and a size of the second hollow particle is smaller than a size of the first hollow particle.

A ratio of a diameter of the second hollow particle to a diameter of the first hollow particle may be 1:4 or larger.

A diameter of the first hollow particle is 150 nm to 1800 nm and a diameter of the second hollow particle may be 30 nm to 300 nm.

The first hollow particle and the second hollow particle may be hollow silica, respectively.

A refractive index of the second hollow particle may be equal to or higher than a refractive index of the first hollow particle.

The linking group may be selected from a siloxane group, a silane group, and a urethane group.

The linking group may be selected from groups represented by following Formulae 1, 2, and 3.

Formula 1

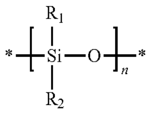

Formula 2

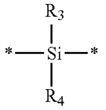

Formula 3

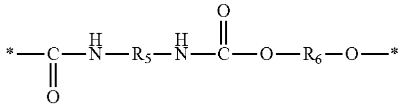

(In Formula 1, $R_1$ and $R_2$ may each independently be selected from H and an alkyl group having 1 to 6 carbon atoms, $R_3$ and $R_4$ may each independently be selected from H and an alkyl group having 1 to 10 carbon atoms, $R_5$ is selected from an alkyl group having 1 to 10 carbon atoms, a cycloalkyl group having 3 to 20 carbon atoms, and an aryl group having 6 to 20 carbon atoms, and $R_6$ may be an alkyl group having 1 to 10 carbon atoms, and n is an integer of 1 to 200).

The black resin may be a resin in which black dye is dispersed in a transparent resin.

Each of the plurality of grooves may be disposed to be spaced apart from each other with a predetermined interval along a first direction perpendicular to a thickness direction of the transparent resin layer and each of the plurality of grooves may penetrate at least a part of the transparent resin layer in the thickness direction of the transparent resin layer.

The transparent resin layer may be in contact with a side surface and a top surface of each of the plurality of light shielding units.

A cross-section of each of the plurality of light shielding units may have a triangular shape or a trapezoidal shape.

According to another aspect of the present disclosure, a display device comprises a display panel; and a light control film which is disposed above or below the display panel, wherein the light control film comprises a transparent resin layer including a plurality of grooves which is disposed to be spaced apart from each other; and a plurality of light shielding units disposed in the plurality of grooves, wherein each of the plurality of light shielding units includes a black resin and a plurality of dispersion particles dispersed in the black resin and the dispersion particles has a structure in which each of a plurality of second hollow particles is coupled onto a surface of a first hollow particle through a linking group and a size of the second hollow particle is smaller than a size of the first hollow particle.

The display panel may be a liquid crystal display panel and may further include a backlight unit disposed below the display panel, and the light control film may be disposed between the liquid crystal display panel and the backlight unit or above the display panel.

The display panel may be an organic light emitting display panel and the light control film may be disposed above the organic light emitting display panel.

The display device may further comprise a variable light diffusion film disposed on the light control film.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. All the technical concepts in the equivalent scope thereof should be construed as falling within the scope of the present disclosure.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light control film, comprising:

a transparent resin layer including a plurality of grooves which are spaced apart from each other; and a plurality of light shielding units disposed in the plurality of grooves, respectively, wherein:

each of the plurality of light shielding units includes a black resin and a plurality of dispersion particles dispersed in the black resin, the dispersion particles each includes a first hollow particle and a plurality of second hollow particles each coupled onto a surface of the first hollow particle through a linking group, and a size of each of the second hollow particles is smaller than a size of the first hollow particle.

2. The light control film according to claim 1, wherein a ratio of a diameter of the second hollow particle to a diameter of the first hollow particle is 1:4 or larger.

3. The light control film according to claim 2, wherein a diameter of the first hollow particle is in a range from 150 nm to 1800 nm and a diameter of the second hollow particle is in a range from 30 nm to 300 nm.

4. The light control film according to claim 1, wherein the first hollow particle and the second hollow particle are hollow silica, respectively.

5. The light control film according to claim 1, wherein a refractive index of each of the plurality of second hollow particles is equal to or higher than a refractive index of the first hollow particle.

6. The light control film according to claim 1, wherein the linking group is selected from one or more of a siloxane group, a silane group, or a urethane group.

7. The light control film according to claim 6, wherein the linking group is selected from groups represented by following Formulae 1, 2, or 3:

Formula 1

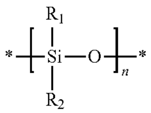

Formula 2

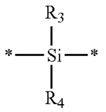

Formula 3

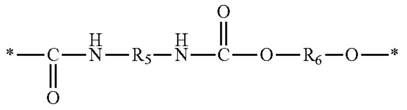

where, $R_1$ and $R_2$ each independently is selected from H and an alkyl group having 1 to 6 carbon atoms, $R_3$ and $R_4$ each independently is selected from H and an alkyl group having 1 to 10 carbon atoms, $R_5$ is selected from an alkyl group having 1 to 10 carbon atoms, a cycloalkyl group having 3 to 20 carbon atoms, or an aryl group having 6 to 20 carbon atoms, and $R_6$ is alkyl group having 1 to 10 carbon atoms, and n is an integer of 1 to 200.

8. The light control film according to claim 1, wherein the black resin includes black dye dispersed in a transparent resin.

9. The light control film according to claim 1, wherein the plurality of grooves are spaced apart from each other with a determined interval along a first direction that traverses a thickness direction of the transparent resin layer and each of the plurality of grooves extends at least partially into the transparent resin layer in the thickness direction of the transparent resin layer.

10. The light control film according to claim 1, wherein the transparent resin layer is in contact with a side surface and a top surface of each of the plurality of light shielding units.

11. The light control film according to claim 1, wherein a cross-section of each of the plurality of light shielding units has a triangular shape or a trapezoidal shape.

12. A display device, comprising:

a display panel; and a light control film which is disposed above or below the display panel, wherein the light control film includes:

a transparent resin layer including a plurality of grooves which are spaced apart from each other; and a plurality of light shielding units disposed in the plurality of grooves, respectively, wherein:

each of the plurality of light shielding units includes a black resin and a plurality of dispersion particles dispersed in the black resin, the dispersion particles each includes a first hollow particle and a plurality of second hollow particles each coupled onto a surface of the first hollow particle through a linking group, and a size of each of the second hollow particles is smaller than a size of the first hollow particle.

13. The display device according to claim 12, wherein the display panel is a liquid crystal display panel, the display device further includes a backlight unit disposed below the display panel, and the light control film is disposed between the liquid crystal display panel and the backlight unit or above the display panel.

14. The display device according to claim 12, wherein the display panel is an organic light emitting display panel and the light control film is disposed above the organic light emitting display panel.

15. The display device according to claim 12, further comprising:

a variable light diffusion film disposed on the light control film.

16. A light control film, comprising:

a transparent resin layer; and a plurality of light shielding units on the transparent resin layer, the plurality of light shielding units spaced apart from one another, wherein:

each of the plurality of light shielding units includes a black resin and a plurality of discrete dispersion particles dispersed in the black resin, and the discrete dispersion particles each includes a first hollow particle and a plurality of second hollow particles each coupled onto a surface of the first hollow particle through a linking group.

17. The light control film according to claim 16, wherein a weight ratio between the first hollow particle and the plurality of second hollow particles in each light shielding unit is in a range from 90:10 to 10:90.

18. The light control film according to claim 16, wherein a refractive index of each of the plurality of light shielding units is lower than a refractive index of the transparent resin layer.

19. The light control film according to claim 16, wherein each light shielding unit includes the plurality of discrete dispersion particles at a concentration of between 5% to 30% by weight.

* * * * *